United States Patent [19]

Gallagher

[11] Patent Number: 5,015,323
[45] Date of Patent: May 14, 1991

[54] MULTI-TIPPED FIELD-EMISSION TOOL FOR NANOSTRUCTURE FABRICATION

[75] Inventor: Alan C. Gallagher, Louisville, Colo.

[73] Assignee: The United States of America as represented by the Secretary of Commerce, Washington, D.C.

[21] Appl. No.: 419,164

[22] Filed: Oct. 10, 1989

[51] Int. Cl.$^5$ .............................................. C23F 1/02
[52] U.S. Cl. ................... 156/345; 250/492.3; 156/643; 427/37; 437/228
[58] Field of Search .................. 156/345, 643, 905; 428/141, 156; 427/37; 264/22; 437/228; 250/310, 311, 492.2, 492.3, 306, 307

[56] References Cited

U.S. PATENT DOCUMENTS

| | | | |
|---|---|---|---|
| 4,343,993 | 9/1982 | Binnig et al. | 250/306 |
| 4,430,149 | 2/1984 | Berkman | 156/613 |
| 4,434,036 | 2/1984 | Hoerschelmann et al. | 204/164 |
| 4,459,163 | 7/1984 | MacDiarmid et al. | 148/174 |
| 4,488,914 | 12/1984 | Quinlan et al. | 148/175 |
| 4,496,609 | 1/1985 | McNeilly et al. | 427/55 |
| 4,539,089 | 9/1985 | Binnig et al. | 204/192 R |
| 4,550,257 | 10/1985 | Binnig et al. | 250/492.2 |
| 4,574,093 | 3/1986 | Cox | 427/86 |
| 4,602,981 | 7/1986 | Chen et al. | 156/627 |
| 4,605,566 | 8/1986 | Matsui et al. | 427/85 |
| 4,618,381 | 10/1986 | Sato et al. | 148/189 |
| 4,690,728 | 9/1987 | Tsang et al. | 156/643 |
| 4,698,122 | 10/1987 | Wada et al. | 156/625 |
| 4,698,129 | 10/1987 | Puretz et al. | 156/643 |
| 4,707,218 | 11/1987 | Giammarco et al. | 156/643 |
| 4,713,140 | 12/1987 | Tien | 156/626 |
| 4,726,879 | 2/1988 | Bondur et al. | 156/643 |
| 4,734,152 | 3/1988 | Geis et al. | 156/646 |
| 4,734,157 | 3/1988 | Carbaugh et al. | 156/643 |
| 4,734,158 | 3/1988 | Gillis | 156/643 |
| 4,740,267 | 4/1988 | Knauer et al. | 156/635 |
| 4,741,799 | 5/1988 | Chen et al. | 156/643 |
| 4,744,861 | 5/1988 | Matsunaga et al. | 156/643 |
| 4,767,496 | 8/1988 | Hieber | 156/627 |
| 4,801,557 | 1/1989 | Wessels et al. | 437/81 |
| 4,804,560 | 2/1989 | Shioya et al. | 427/125 |
| 4,808,551 | 2/1989 | Mori et al. | 437/81 |
| 4,810,335 | 3/1989 | Hieber | 204/192.33 |
| 4,851,097 | 7/1989 | Hattori et al. | 156/345 |
| 4,874,459 | 10/1989 | Coldren et al. | 156/345 |
| 4,874,460 | 10/1989 | Nakagawa et al. | 156/345 |
| 4,896,044 | 1/1990 | Li et al. | 250/492.3 |

FOREIGN PATENT DOCUMENTS 3006604 8/1981 Fed. Rep. of Germany .
59-71474 4/1984 Japan .

OTHER PUBLICATIONS

Ringger, M. et al., Nanometer Lithography with the Scanning Tunneling Microscope, Appl. Phys. Lett. 46(9), 1 May 1985, pp. 832-834.

Drake et al., Tunneling Microscope for Operation in Air or Fluids, Review of Scientific Instruments, 57(3), Mar. '86, pp. 441-445.

(List continued on next page.)

*Primary Examiner*—Kenneth M. Schor
*Assistant Examiner*—John J. Bruckner
*Attorney, Agent, or Firm*—Alvin J. Englert; Richard Torczon; David A. Blumenthal

[57] ABSTRACT

A tool consists of an array of field-emitting nanostructure probe tip extensions on the end of a metal probe. The probe is tapered to a long, narrow, flat end with typical dimensions of 1 cm × 1 μm. The probe tip extensions typically extend approximately 100 Å beyond the probe surface and their ends are shaped to act as independent field-emission tips, each at an exact atomic location. These ends are a single crystal plane terminating in a single crystal unit plane cell having a central atom with a lower work function than the atoms surrounding the central atom. The nanostructures are spaced in a prescribed, repeating pattern with typical spacings on the order of 400 Å. The probe voltage, current and position, as well as CVD or etching gas pressures, are sequentially adjusted to fabricate nanostructures on a nearby substrate, which is typically 10–30 Å below the termination points of the probe tip extensions.

7 Claims, 5 Drawing Sheets

OTHER PUBLICATIONS

Staufer, Nanometer Scale Structure Fabrication with STM, Applied Physics Letters, vol. 51, No. 4, Jul. 27, 1987, pp. 244–246.

Silver, Direct Writing of Submicron Metallic Features with STM, Applied Physics Letters, vol. 51, No. 4, Jul. 27, 1987, pp. 247–249.

Binning, Surface Studies by STM, Physical Review Letters, vol. 49, No. 1, Jul. 5, 1982, pp. 57–60.

Binning, 7×7 Reconstruction on Si(III) Resolved in Real Space, Physical Review Letters, vol. 50, No. 2, Jan. 10, '83, pp. 120–123.

McCord and Pease, "High Resolution, Low-Voltage Probes . . .", *J. Vac. Sci. Technol. B* 3(1), (Jan./Feb. 1985).

Demuth et al., "A Scanning Tunneling Microscope for Surface Science Studies", *IBM J. Res. Develop*, vol. 30, No. 4, (Jul. 1986).

Chang et al., "Nanostructure Technology", IBM J. Res. Develop. 32, 462 (1988).

Hohn et al., "Advanced Electron-Beam Lithography for 0.5 $\mu$m to 0.25 $\mu$m Device Fabrication", IBM J. Res. Develop. 32 514 (1988).

McCord et al., "Lithography with the Scanning Tunneling Microscope", J. Vac. Sci. Technol. B 4, 86 (1986).

Lin et al., "High Resolution Photoelectrochemical Etching of n-GaAs with the Scanning Electrochemical and Tunneling Microscope", J. Electrochem. Soc. 134, 1038 (1987).

Abraham et al., "Surface Modification with the Scanning Tunneling Microscope", IBM J. R–s. Develop. 30, 492 (19).

McCord et al., "Scanning Tunneling Microscope as a Micromechanical Tool", Appl. Phys. Lett. 50, 569 (1987).

Becker et al., "Atomic-Sale Surface Modifications Using a Tunneling Microscope", Nature 325, 419 (1987).

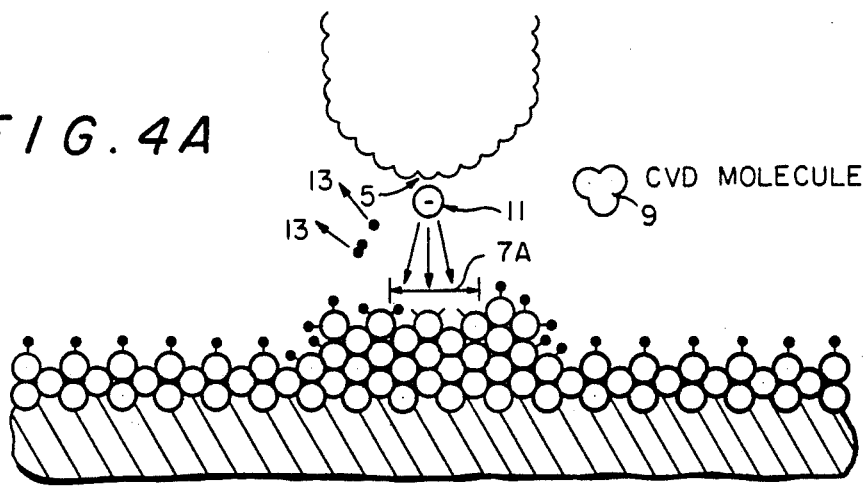
FIG. 4A
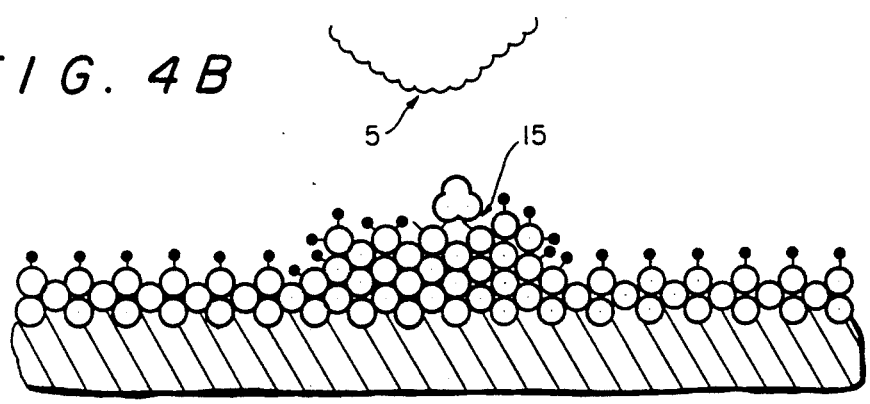
FIG. 4B
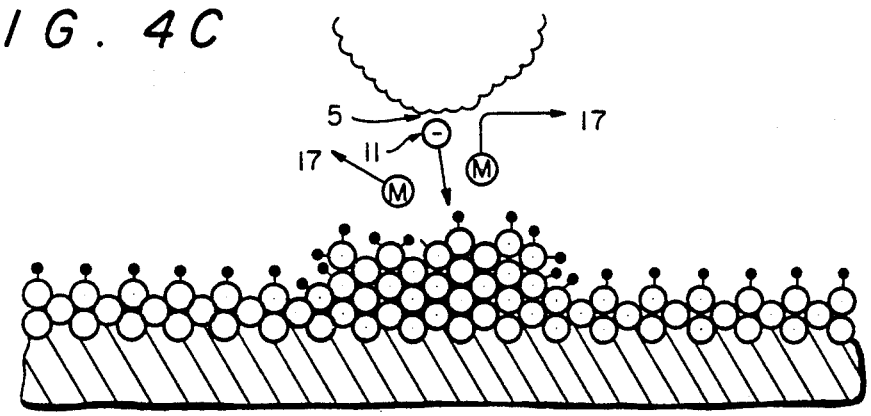
FIG. 4C
FIG. 5A
FRONT
FIG. 5B
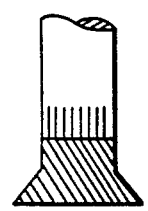
SIDE

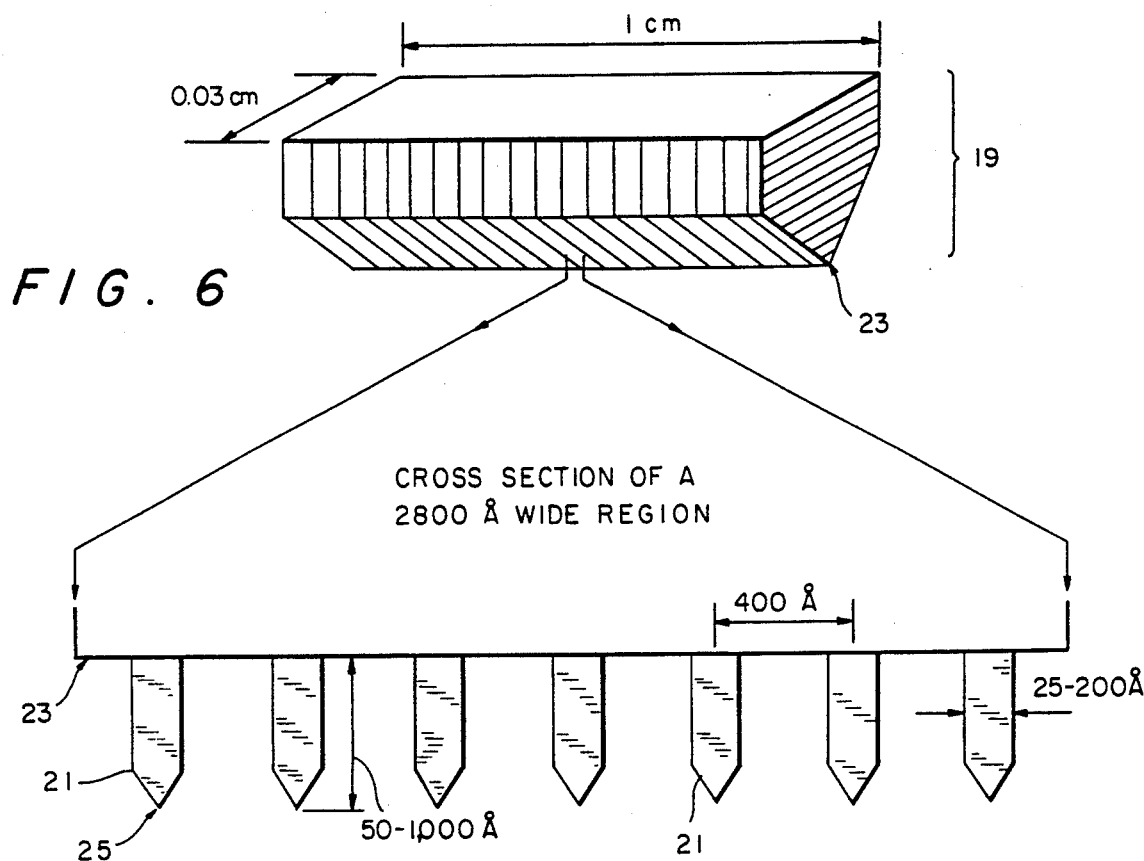
FIG. 6
FIG. 7
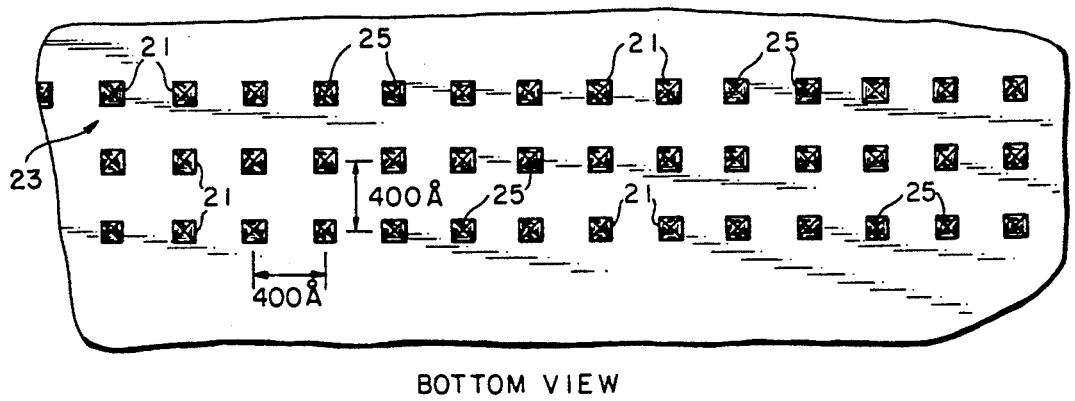
BOTTOM VIEW

MULTI-TIPPED FIELD-EMISSION TOOL FOR NANOSTRUCTURE FABRICATION

BACKGROUND OF THE INVENTION

Producing ever-smaller semiconductor devices and computer-memory elements for VLSI is one of the most competitive and economically important technologies in the world. Additional, important applications of microscopic structures include catalysis, optical devices and computing, and superconductors.

The smallest structures currently used in VLSI have typical dimensions of approximately 1 $\mu$m and edge definitions of approximately 0.05 $\mu$m or 500 Å. In this regard, see Chang et al., "Nanostructure Technology", IBM J. Res. Develop. 32, 462 (1988); and Hohn et al., "Advanced Electron-beam Lithography for 0.5 $\mu$m to 0.25 $\mu$m Device Fabrication," IBM J. Res. Develop. 32, 514 (1988). Fine pattern-lines are often a part of these devices, and these may have widths of 100-500 Å. These structures and lines are normally made by "lithography", first exposing portions of substrate-covering resists, either through masks or by direct bombardment with photon, ion or electron beams. The unexposed (or opposite) portion of the resist is then chemically removed and the resulting exposed portions of the substrate are etched or overcoated.

These latter steps typically involve vapor or liquid deposition and etching, sometimes plasma assisted. This lithographic process is repeated with different masks and etch, doping or coating steps to produce the final device. Doping of various layers is typically achieved by highly energetic ion bombardment, driving dopant species into the material, or by diffusion inward from the exposed surface at elevated temperatures. Although high-energy electron and ion beams can be focused more finely than 100 Å, the size of the resulting pattern is limited so far to greater 100 Å by the scattering of these particles at the film surface, which spreads the pattern. Etching also tends to spread patterns.

The scanning-tunneling-microscope (STM) described in U.S. Pat. No. 4,343,993 produces a highly-localized beam of low-energy electrons, so that it is feasible to use this instrument for nanolithography (See Binnig et al., Phys. Rev. Lett., 49. 57 (1982) and 50. 120 (1983)). In two reported attempts at this, lines of apparently ~100 Å width were achieved by exposing a resist and a glassy alloy to the electron current from an STM (See McCord et al., "Lithography with the Scanning Tunneling Microscope", J. Vac. Sci. Technol. B 4, 86 (1986); and Ringer et al., "Nanometer Lithography with the Scanning Tunneling Microscope", Appl. Phys. Lett. 46, 832 (1985)).

Another approach to writing fine lines or depositing metallic lines on a substrate with an STM can be found in U.S. Pat. No. 4,550,257. Here it was proposed that metal-atom containing gas molecules, introduced into a vacuum system, would be dissociated by the electron beam from a typically 5 V biased STM tip. The electrons would collisionally dissociate some of the gas molecules as they passed between tip and substrate, and for a tip-substrate spacing of approximately 20 Å the dissociation products would strike and build up in a very local region of the substrate, producing a metal line of very narrow width as the tip is scanned parallel to the surface. As described in Silver et al., "Direct Writing of Submicron Metallic Features with a Scanning Tunneling Microscope", Appl. Phys. Lett. 51, 247 (1987), there were some complications and this was not successfully achieved by the patentees. Furthermore, this device does not permit single-atom depositional control of the atomic substituents, but rather is directed to a random deposition mechanism.

However, in 1987 a short, approximately 250 Å wide line of Cd was deposited from Cd $(CH_3)_2$ gas onto a photolithography material using an STM current, by a different research group who used quite different conditions and suggest that the deposition was probably due to microscopic plasma between the probe and substrate (See Silver et al.). The authors further report the possibility of also achieving etch patterns below an STM tip, using halogen molecules in place of the metal organic molecules often used for deposition. According to Lin et al., "High Resolution Photoelectrochemical Etching of n-GaAs with the Scanning Electrochemical and Tunneling Microscope", J. Electrochem. Soc. 134, 1038 (1987), STM-tip controlled etching of GaAs has been achieved by immersing in an electrolyte liquid and at the same time illuminating the gap to induce photochemical reactions. Here the tip-substrate spacing was approximately 1 $\mu$m and 0.3-2 $\mu$m wide etch patterns were obtained, using unspecified conditions.

Mechanical "scratching" of fine lines with a tungsten STM probe tip has also been reported in Abraham et al., "Surface Modification with the Scanning Tunneling Microscope", IBM J. Res. Develop. 30, 492 (19); and McCord et al., "Scanning Tunneling Microscope as a Micromechanical Tool", Appl. Phys. Lett. 50, 569 (1987). Transfer of single Ge atoms, apparently from a scratch-coated tungsten probe tip to a Ge crystal, has also been reported in Becker et al., "Atomic-scale Surface Modifications Using a Tunneling Microscope", Nature 325, 419 (1987).

Writing narrow metal lines by probe-to-substrate metal-atom transfer, induced by field desorption at the highest-field probe tip end, has been patented by Binnig et al. in U.S. Pat. No. 4,539,089. Here the metal atoms (e.g. Au atoms) diffuse about the heated tungsten tip and are continuously supplied at the upper end. This patent, however, is not based on the use of chemical vapor deposition (hereinafter CVD) molecules to bring the depositing atoms to the nanostructure, but rather is directed toward laying down metal lines.

The above investigations and patents were directed towards adding fine lines of homogeneous unstructured material to produce a mask for the lithographic method of VLSI semiconductor production. The overwhelming majority of the prior art is also based on the construction of lithographic masks using photon electron or ion beams, since the total time required to produce the entire VLSI pattern would be prohibitive without multiple use of the mask. These are several problems associated with the use of these beams to produce very fine-lined masks. These include, for example, (1) a high-energy electron or ion beam traversing a large gap (necessary for focusing) which ionizes and dissociates the gas along the entire path, producing deposition everywhere, and a discharge if pressures exceed ~0.01 Torr; (2) energetic electrons from high-energy electron beams which scatter and spread from the initial point of contact, producing gas dissociation, deposition and sometimes film damage over an extended region; (3) energetic ions causing severe substrate damage about the point of impact, as well as inducing sputtering; ion beams are well-suited to producing masks or sputtering-away substrates, but not to deposition; (4) the laser spot size being diffraction limited, so that it can not be used for ≦100 nm scale writing; (5) the fact that none of the beam methods can directly detect, at the nm level, the consequences of their action on the substrate surface, and thus there is no self-adjustment ability.

Some of the problems plaguing the attempts at STM-based lithography can be attributed to the nanometer probe tip which is utilized. The standard STM probe tip has a radius of curvature of ≧1000 Angstroms (Å), and when this is placed close enough to the substrate to yield a single field-emission point (generally 1–30 Å) the probe tip to substrate spacing changes very little over a circle of a few hundred Å diameter. It is thus extremely difficult for CVD molecules to diffuse through this narrow gap to the center, where deposition is intended. Furthermore, the molecules traverse this gap with repeated surface absorptions and desorptions, and the field-emission current is often drawn to the adsorbed CVD molecule because it lowers the field-emission tunneling barrier. Thus, the CVD molecule is almost certain to be collisionally dissociated and attach to substrate or probe long before reaching the normal emitting point at the center. The result is enormous STM current noise accompanied by tip-shape and substrate deterioration as CVD atoms deposit randomly all over this extended probe and substrate region. If the probe-substrate spacing is increased beyond the normal range, the gas-flow problem is somewhat alleviated but the emitting point is even less well defined and the CVD molecules still attract the emission current and deposit over a large region ($>100$ Å).

Nanostructure fabrication of large arrays (typically $10^6$–$10^{12}$) of device would require a parallel-process fabrication method and tool to be acceptable in terms of manufacturing time. In present-day semiconductor technology fabrication is achieved by lithography, and devices with dimensions as small as approximately 5000 Å are achieved in a manufacturing context. Here a substrate resist is exposed through a mask which contains an array of repeating shapes; thus the entire substrate is "written" in one exposure. Of course, the mask itself has to be created and several different mask and exposure steps are necessary for each device, but masks can be used many times. Masks are formed with the necessary fine lines using optical, electron, x-ray, $\gamma$-ray or ion beams, with current smallest-size limits of approximately 200 Å. Etching or deposition occurs on the exposed portions of the substrate and further limits practical smallest sizes.

Thus, no current method is capable of forming single or multiple-pattern nanostructures with non-random control of atomic constituents other than those of the starting crystal, nor has any achieved <200 Å dimensions. (The current status of small-device technology is further reviewed in the two previously described articles by Chang et al., and Hohn et al.) These methods do not appear capable of achieving ≦100 Å nanostructures with the single-atom dimensional and chemical control necessary to be useful. Thus, even with future advances in current lithographic methods there may be no competing methodology to that which will be described herein as part of the present invention.

OBJECTS OF THE INVENTION

It is therefore an object of the present invention to provide a semiconductor-production process that replaces the entire lithographic method with direct construction, doping and interconnecting of three-dimensional nanostructures.

Another object of the present invention is to provide a device and method which is capable of forming semiconductor devices or nanostructures with non-random control of atomic constituents.

It is a further object of the invention to provide a fabrication device and method which will produce nanostructures of less than 200 Å, preferably of less than 100 Å, with single-atom dimensional and chemical control necessary to be useful.

Still another object of the invention is to provide a parallel-process nanostructure fabrication tool and method which will make possible the fabrication of large arrays (typically $10^6$–$10^{12}$) of devices in an acceptable manufacturing time.

An additional object of the invention is to provide a fabrication method for very finely structured lithographic masks, with dimensional accuracies of about 10 Å.

A further object of the invention is to describe a procedure by which nanostructure probe tip extensions can be constructed on the end of a field-emitting probe for further utilization in a nanostructure fabrication method.

Still a further object of the present invention is to describe physical mechanisms and operating conditions that produce nanometer-scale structures as well as the crystalline morphology which is essential to VLSI circuits and other applications.

Another object of the invention is to provide a method for accurately positioning a large array of nanostructures on a substrate.

SUMMARY OF THE INVENTION

These and other objects are achieved by providing a device for the fabrication of molecular or crystalline nanostructures on a substrate surface comprising a field-emitting probe and at least one probe tip extension which extends from an end surface of said probe.

There is also provided a method for the fabrication of molecular or crystalline nanostructures on a substrate surface utilizing a field-emitting probe with at least one probe tip extension which comprises the steps of:
(1) positioning said probe tip extension of said field-emitting probe above a site on said substrate surface;
(2) applying a deposition voltage to said tip and monitoring the current;
(3) introducing gases between said probe tip extension and said substrate surface, at least one of said gases being decomposed and deposited on said substrate surface;
(4) detecting a deposition-induced current change in said tip; and
(5) reducing said voltage.

Furthermore, a multi-tipped field emitting probe for fabrication of molecular or crystalline nanostructures on a substrate surface is provided which comprises a series of probe tip extensions.

Also disclosed is a method for fabricating at least one probe tip extension on an end surface of a field-emitting probe which comprises the steps of:
(1) applying a voltage to said field-emitting probe;
(2) positioning a first site on said end surface of said probe above a metal substrate surface;
(3) introducing CVD gas between said first site and said substrate surface, said CVD gas being decomposed and deposited on said substrate surface to form a nanostructure;

(4) positioning a second site on said end surface of said probe above said nanostructure;

(5) reversing said voltage to said probe;

(6) introducing said CVD gas between said nanostructure and said second site on said end surface of said probe, said CVD gas being decomposed and deposited on said second site to form a probe tip extension.

Steps (2) through (6) can then be repeated until a nanostructure with desired single-atom dimensional accuracy is obtained on the probe.

Furthermore, there is provided a method for the accurate positioning of a large array of nanostructures on a substrate surface using at least two probe tip extensions, which comprises the steps of:

(1) using said probe tip extensions, successively depositing nanostructure markers at regular spacings on said substrate surface;

(2) repositioning said probe tip extensions between successive depositions using an STM detecting technique to detect a previously deposited marker; and (3) depositing successive arrays of nanostructures on said substrate surface using said nanostructure markers as positional reference points.

BRIEF DESCRIPTION OF THE DRAWINGS

FIGS. 4A–4C illustrates a three-step CVD deposition process utilizing the probe tip extension according to the present invention.

FIG. 5A is an outline of a front view of an etching tip.

FIG. 5B is an outline of a side view of an etching tip.

FIG. 6 is an enlarged cross-section of a 2800 Å wide region of a multi-tipped probe.

FIG. 7 is a bottom view of the deposition probe tip extensions of the multi-tipped probe illustrated in FIG. 6.

DETAILED DESCRIPTION OF THE PREFERRED EMBODIMENTS

For very small structures (e.g. less than $10^5$ atoms) the traditional lithographic method based on random-doping (by diffusion or bombardment) cannot be used for semiconductor or chemical devices, and must be replaced by exact, single-atom control of dopant deposition.

The nanostructure fabrication device according to the invention comprises a field-emitting probe and at least one probe tip extension, typically of tungsten or with a tungsten tip, which is positioned about 10 Å above a substrate or the growing nanostructure surface for deposition. The probe tip shape, operating parameters, and positioning sequence of the device according to the present invention are entirely unique. The probe end is negatively biased and the gap, tip-shape and tip-end chemical composition are designed to simultaneously achieve a desired current-voltage characteristic and a very small, preferably 5 current-impact zone on the substrate surface.

The probe tip extension is important in controlling the emitting point in the presence of depositions on tip and substrate, as well as to minimize i changes due to any adsorption, deposition, and desorption processes other than substrate deposition immediately below the point.

Figure 1:
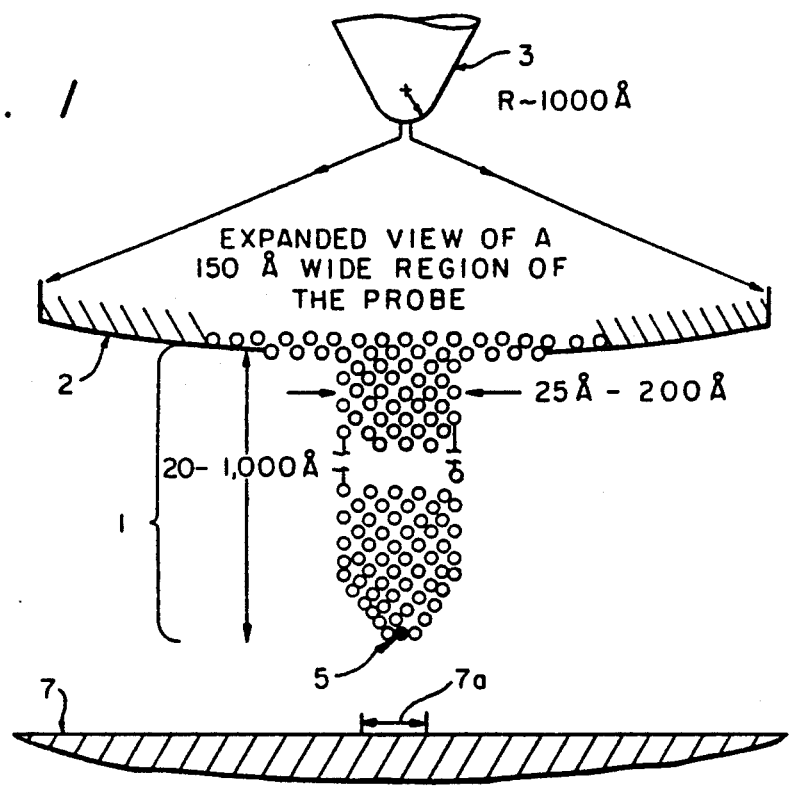
FIG. 1 is an expanded view of a 150 Å wide region of a metal field-emitting probe and an example deposition probe tip extension according to the present invention.

FIG. 1 illustrates an expanded view of a 150 Å wide region of a metal field-emitting probe 3 whose radius of curvature is about 1000 Å. The probe tip extension 1 is a nanostructure extension from the end surface 2 of the probe 3 and is utilized to accurately control the current location on the growing substrate nanostructure and to allow measurement of its growth. Preferably, the probe tip extension 1 is downwardly extending and generally symmetrical about a vertical axis and tapers and terminates at its lowermost point 5. This termination point 5 will normally consist of a single atom, or a single crystal unit plane cell.

The example probe tip extension 1 shown in FIG. 1 is about 25 Å wide and about 70 Å in length, but can be about 25 to about 200 Å in diameter or width, and from about 20 to about 1000 Å in length (from probe end surface to termination point). Preferably, the probe tip extension 1 will be about 50 to about 150 Å in length The probe tip extension can be constructed on the etched tip of, for example, a tungsten wire by a nanostructure fabrication technique in which the probe end is treated as the positively-biased "substrate." This technique is referred to as the "bootstrap" procedure, in which successively smaller, more peaked nanostructures are grown on different portions of the probe end and substrate.

Referring now to FIGS. 2A through 2D which illustrate the bootstrap procedure, an STM is first set to operate in an ultra high vacuum (hereinafter UHV) chamber. An electrolytically etched metallic field-emitting probe 3, preferably of tungsten, with approximately 100 to about 400 nm typical tip radius, is then placed above a flat region of the metallic substrate 7, at a lateral position A near any identifying substrate scratches that are visible in an optical microscope. Any probe tip can thus be optically located within approximately 1000 nm of this particular region of the substrate. The probe tip end 3 is then lowered to within approximately 10 nm of the substrate surface 7, using approximately $-200$V tip voltage and $-1$ nA tunneling current feedback. The exact value of the gap between probe tip end and substrate is not critical.

CVD gases, preferably $WF_6$ and $H_2$ gas, are then introduced into the vacuum chamber and constant current feedback is maintained while W atom deposition occurs below the probe tip 3. A range of gas pressures can be used; typical pressures are in the range of about 0.01 to about 1 Torr. Deposition is discerned as a steady increase in the tip z-piezo voltage, as the tip end backs away from the substrate to maintain constant current. Very low feedback bandwidth is preferably used, as the current can be very noisy. When the probe tip end has moved back approximately 20 nm from the substrate the gas is pumped away. Most deposition has occurred on the substrate as shown by Deposit 1 diagrammatically in FIG. 2A, but if needed the probe can be moved to a new area of the surface and cleaned or smoothed by field-induced ion desorption using a large positive probe bias.

The probe is then returned to the region of position A and positioned approximately 5 nm above the highpoint of the substrate Deposit 1, again using standard STM scanning methodology to detect this position. Next, the probe is approximately +50V biased and the same gases are again introduced into the chamber while approximately 1 nA current feedback controls the spacing between the probe tip end and the substrate deposit. A much more sharply-peaked deposit (Deposit 2 in FIG. 2B) then grows primarily on the probe tip end at B, since the tunneling current region is confined by the peaked substrate deposit. Once the probe z position has again moved back approximately 20 nm following the growth of the deposit, the gas is again removed and the probe is moved to a clean new region of the substrate as in FIG. 2C. Here an approximately 20 nm high, steep-sided structure (Deposit 3 in FIG. 2C) is deposited on the substrate using approximately −20V probe bias and some x and y motion to broaden the structure base.

This Deposit 3 structure is then used, with approximately +10V probe bias, to deposit the desired probe tip extension structure at point D (Deposit 4 in FIG. 2D) either on the original probe end after field-ion-desorption probe cleaning, or on a new probe wire. For the Deposit 4 deposition, x, y and z are adjusted to yield sequential tungsten atom deposition at planned positions, particularly near the termination tip of Deposit 4. (Deposits 4A and 4B in FIG. 2D can both be tungsten, and in combination are called deposit 4; in another embodiment Deposit 4A can be a resistive material, e.g. GaAs, and 4B can be a metal conductor, e.g. tungsten). Each single-atom deposition is detected by the accompanying backward z motion (z-piezo voltage change) in the constant current mode, and deposition is terminated between depositions by lowering the probe voltage to less than 1V while moving to the next position. This is the basic deposition-control method that is also used to build nanostructures on substrates with single atom chemical and positional control.

The shapes of Deposit 3 and Deposit 4 can also be established by STM constant-current scanning. The z (x,y) result of such STM scans are a convolution of the probe and substrate-structure shapes, hence the steep-sided character of Deposit 3 and Deposit 4 can only be discerned once both structures are formed (e.g. a 10 nm wide substrate structure of height h approximately 10 nm will appear as an approximately 100 nm radius mound of height h when scanned with a normal 100 nm radius probe tip.) It should be noted that those skilled in the art may find it necessary to make additional deposits on the substrate surface and probe end until a probe tip extension with the desired length and shape is obtained.

Referring again to FIG. 1, the probe tip extension is used to fabricate nanostructures on a substrate surface in a traditional ultra-high vacuum (UHV) chamber (not shown). Using traditional low-current (approximately $10^{-9}$A), low-voltage (approximately 0.1V), and STM feedback methodology the probe tip extension termination point 5 is placed at a desired position, preferably about 10 Å above the substrate 7 or substrate-nanostructure site where deposition is desired. The taper of the probe tip extension to a single-atom termination causes current emission from this single atom, and consequently deposition within an approximately 5 Å diameter current-impact zone 7A on the substrate surface. With the initial probe position fixed an appropriate deposition voltage is then applied to the probe tip extension 1 through the probe 3 and the current is monitored.

CVD gases (e.g. silanes or "metal organics" such as $AsH_3$, $Ge(CH_3)_3$, $GaCl_3$, $SiH_4$ or $W(CO)_6$) are next introduced into the vacuum chamber, and the metal, Si or appropriate atoms are deposited on the substrate within the impact zone 7A. When a current "step" or increase occurs, atomic deposition has taken place below the probe tip extension termination point 5 such that the gap vertical distance between the probe tip extension termination point 5 and the impact zone 7A has decreased by from about 1 to about 5 Å, typically about 2 Å. At this time, the voltage is reduced to the low, scanning value, less than 1V and preferably 0.1V, until the probe point is stepped to and stabilized at the next deposition site. The deposition voltage is then reapplied to the probe tip extension through the probe, and the current is again monitored for deposition. Through this careful monitoring of the current feedback for each atomic deposition it is possible to achieve precise single-atom depositional control within a very small current-impact zone, thereby greatly facilitating the fabrication of nanostructures whose dimensions are approximately 100 Å or less.

When dopants or different atomic specie depositions are desired the probe is maintained at constant position in the low i, V mode while gas-exchange is accomplished. The atomic character of specific deposited atoms is checked, when necessary, by traditional i versus gap STM. Here again, the nanostructure probe tip extension is necessary to accurately define the location being probed in the presence of chemically-varying nanostructure surface atoms.

As described in the following paragraphs, several different deposition or etching tip currents and voltage ranges can be used. Each is associated with a particular deposition and/or etching mechanism and methods A, B and D are appropriate for fabricating various types of substrate-nanostructure materials. These methods are: (A) Heated-surface mechanism, applicable to conducting substrates ($\rho < 10^{-2}$ ohm-cm), typically with $V_t = -3V$, $i = 3 \times 10^{-5}A$. (B) Activated-surface mechanism, applicable to all substrate materials, typically with $V_t = -5V$, $i \leq 10^{-7}A$. (C) Gas dissociation mechanism, typically with $V_t = -10V$, $i \leq 10^{-8}A$. (D) Adsorbed-molecule incorporation, typically with $V_t = -5V$, $i \leq 10^{12}A$.

(A) Referring now to FIGS. 3 and 4A through 4C, an alternate type of emitting tip is illustrated. Here the desired single-atom emission and very small substrate impact zone is attained by a tip end that terminates in a single crystal unit plane cell, with a different lower work-function atom in the center (e.g., a molybdenum atom in an otherwise.

Figure 3:
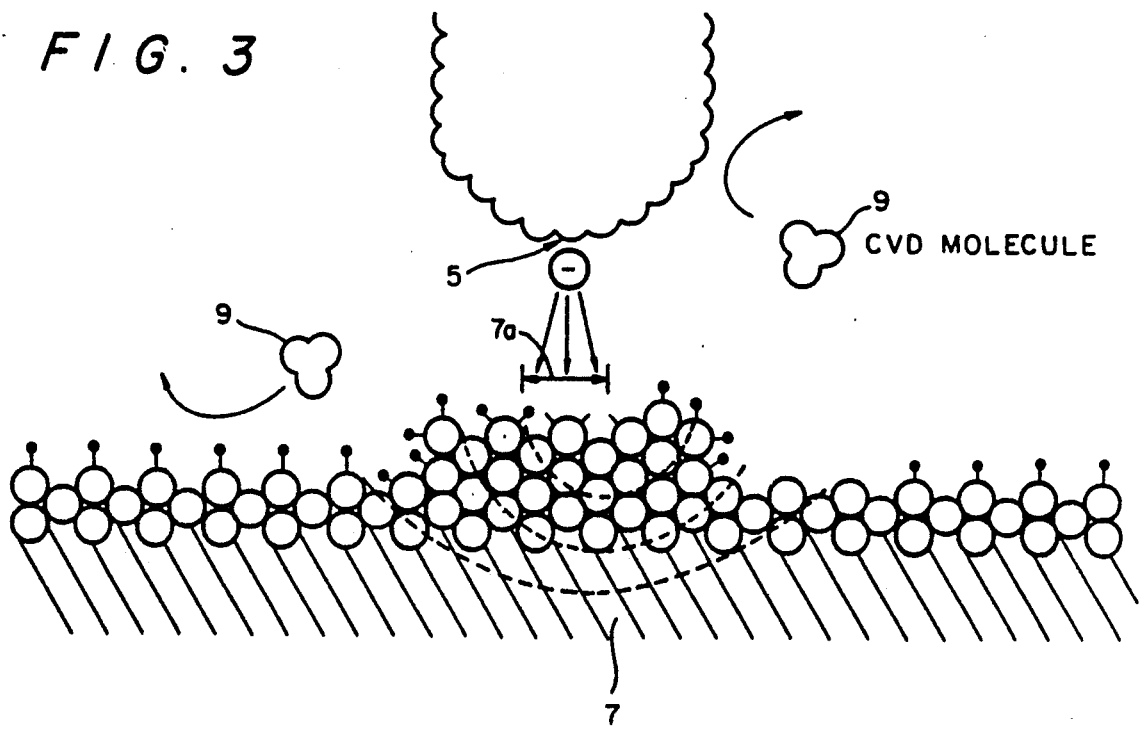
FIG. 3 is an illustration of a thermal CVD deposition mechanism utilizing the probe tip extension according to the present invention.

In FIG. 3, a heating power $P = |i \times V_t|$ is delivered to the region of the substrate impact zone 7A by the "tunneling current", which is actually the field-emission current for the tip shape and gaps which have already been described herein. For crystalline semiconductor growth on a latticematched crystal substrate by this method, the power is adjusted to heat the impact-zone 7A to CVD epitaxial-growth temperature T, which is, for example about 700° C for Si and GaAs. ($P_t$ must be adjusted somewhat to maintain T in an acceptable range as the microstructure grows above the substrate. One way to achieve this is by monitoring the deposition rate, since this is a very strong function of T.) Those skilled in the art will recognize that $P_t$ and T can be furthered adjusted for different substrate components.

The tip-substrate spacing is initially held constant at approximately 10 Å by traditional STM current-controlled feedback until any thermally-induced substrate expansion has stabilized, then the CVD gases 9 are introduced into the chamber, typically at $10^{-6} - 1$ Torr. These gases will not react with the cold portions of the substrate, but they can reactively decompose and adhere to the hot substrate atoms within the impact zone. A chemical process responsible for normal low-pressure thermal CVD has been described (See Robertson et al., "Silane Pyrolysis", Chem. Phys. Lett. 103, 397 (1984); and "Reaction Mechanism and Kinetics of Silane Pyrolysis on a Hydrogenated Amorphous Silicon Surface", J. Chem. Phys. 85, 3623 (1986)), but according to the present invention it occurs only at a very small, heated substrate impact region 7A, that region being approximately 5Å in diameter. The decomposition probability ($\gamma$) per surface deposition increases very rapidly with substrate temperature T ($\gamma \alpha \exp\{-\Delta E/T\}$ with $\Delta E = 1-4$ eV), while the substrate temperature decreases rapidly outside the impact zone. Thus, thermal surface deposition almost always occurs within or very close to the impact zone 7A. At the same time H and C atoms, from H, $CH_3$ or $C_2H_5$ components of the CVD molecules, are desorbed (primarily as $H_2$ or $CH_4$) by the high substrate temperature, as occurs in the normal epitaxial CVD. Undesirable gas reactions, such as these that lead to C incorporation into GaAs, do not occur significantly here because of the very small heated region.

The high current ($10^{-5} - 10^{-4}$ A) necessary for this low-voltage heating-method of deposition may sometimes cause an undesirable substrate and nanostructure voltage drop $\Delta V/\Delta T = \rho K/V_t$, where $\rho$ is the resistivity and K the thermal conductivity.

(C) Gas dissociation into reactive neutral radicals may be considered the least site-specific and most deleterious form of deposition, as these dissociation products are not confined to the substrate. The radicals separate isotropically and the resulting metal-atom or lattice-atom deposition on the probe tip extension, sometimes followed by field desorption, yields current-changing "noise" that obscures the substrate-deposition signal. In addition, changes in the tip emitting-point and tip-shape occur, causing loss of deposition-position control and errors in the apparent nanostructure shape. These gas dissociations result primarily from electronic excitation of the molecule, and have thresholds of 6-10 eV. Thus, although this is the deposition mechanism suggested in U.S. Pat. No. 4,550,257, it should be avoided as much as possible. (This mechanism is shown diagrammatically in the '257 patent, and therefore is not shown here.) This gas dissociation can be avoided by using $|V_t| < 6V$ and/or low tip currents. It is largely avoided in the heating mechanism (A) by the $V_t = -3V$ condition, and in the adsorption mechanism (D) (hereinafter described) by the low currents and pressures, which are compensated by the much larger deposition efficiency of mechanism (D).

(D) Referring again to FIGS. 4A through 4C, the CVD molecules 9 typically have substrate-surface adsorption energies of $E_a = 0.2-0.5$ eV, resulting in a steady-state density of adsorbed molecules on a approximately 3 Å surface site that exceeds the gas density in a 3 Å cube by a factor of $\exp(-E/kT) = 10^3 - 10^8$ for T = 300 K. The probability that a gas molecule is within the region below the tip traversed by the electron current is about 10 (Torr), so the electron beam has a much greater probability of striking an adsorbed molecule than a gas molecule for $P \leq 10^3$ Torr. This propensity is $\geq 10^8$ when the substrate surface-bonded H atoms are collisionally desorbed, as described in part (B), resulting in $E_a \geq 0.5$ eV. This allows very efficient and site-specific deposition at very low i ($\leq 10^{-12}$ A) and P ($\leq 1$ Torr), based on the three-step mechanism of H-desorption, CVD-molecule adsorption, and electron collision with the adsorbed molecule. Examples of CVD gas radicals include H, F, or Cl atoms, or $CH_3$.

In FIG. 4A, an electron 11 emitted from the probe tip termination point 5 strikes the impact zone 7A of the substrate surface, and causes H or $H_2$ desorption 13. A CVD molecule 9 introduced into the reaction chamber is then strongly absorbed on the substrate surface at point 15 as in FIG. 4B. Lattice-atom bonding then occurs with the further assistance of electron bombardment 11 as shown in FIG. 4C. In the FIG. 4C example, the CVD molecule contains methyl radicals, and methyl groups 17 are desorbed during and after lattice-atom bonding.

Desorbed $CH_3$ or other radicals will occasionally adhere to the probe tip extension, causing undesirable changes such as those described in Sec. (C). This is much less significant than in Sec. (C) where metal or lattice atoms are deposited on the probe tip extension. Here it is minimized by first H-atom or F-atom passivating the surface of the probe tip extension, and by the extended microstructure tip shape, which minimizes the consequences of deposition anywhere but at the termination point. When tip-deposition occasionally occurs, it is removed by a field-desorption or inert-gas-ion bombardment cycle above a different region of the substrate.

Crystalline structures will directly result for some materials; for others it is achieved by post-deposition or intermittent heating of the nanostructure substrate, using $P_t$ as described in part (A) or laser-radiation.

It is to be noted that methods A, B, and D are particularly well-suited towards achieving single-atom control of CVD-based nanostructure fabrication. After deposition, the probe tip extension 1 can then be used to measure the shape of the substrate nanostructure, using traditional STM scanning in vacuum.

Referring now to FIGS. 5A and 5B, all of the above 4 mechanisms (A) through (D) will also yield tip-current controlled etching of crystalline materials, particularly Si and GaAs. FIGS. 5A and 5B illustrate an example of an etching tip which can be employed for this purpose. This is normally done by introducing $F_2$ gas into the vacuum chamber, but any etchant gases used in plasma-enhanced etching are appropriate. F atoms replace H atoms in the above passivation of lattice-atom surface bonds, in the chemical surface activation, etc.

An additional mechanism can be used for etching, but is less appropriate for deposition. Here the probe may be positively biased by 30-300V, such that field ionization of etchant gases near the nanostructure tip causes energetic etchant-ion bombardment of the nearby substrate. However, this method cannot achieve the deep, narrow trench etching and exacting (atomic-scale) position control of methods A, B, and D.

Referring now to FIG. 6, for parallel process nanostructure fabrication of large arrays of devices a multi-tipped emitting probe 19 is utilized with a plurality of individual probe tip extensions 21 extending from a flat probe end surface 23. Identical nanostructures are simultaneously deposited or etched below the termination point 25 of each probe tip extension.

The probe consists of an electrical conductor that is, for example, 1 cm $\times$ 3 mm in cross-section and 1 cm in height, with the lower end tapered to a knife-edge by grinding and/or cleaving. This knife-edge is then formed into the atomically flat surface 23 (1 μm × 1 cm in this example). One way of producing this flat surface is by placing the initially mechanically-formed knife edge above a cleaved, atomically-flat substrate in the same, STM-type mount that will next be used to form the tip end nanostructure extensions. Mechanical abrasion, then field-desorption and/or STM-current induced etching in $F_2$ will then remove probe tip atoms, transforming the probe tip into an approximately 1 μm × cm wide atomically-flat surface.

The array of nanostructure probe tip extensions 21 are then formed on the end surface 23 of the probe 19 by a tip-current controlled nanostructure deposition or etching method. To produce a large array in a reasonable production time a small group is first made one at a time, then these are used to simultaneously fabricate one group at a time, etc. For example, a linear array of N about 100 to about 1000 structures can be first formed one at a time at the desired spacings on a substrate. This substrate would then be used as the tip-current emitter, by reversing the voltage, and repeated arrays of $N_1$ nanostructures would be formed $N_2$ times on the probe. If necessary, this multiplication process would be repeated one or two more times, until the desired total number of nanostructure probe tip extensions are formed on the probe. For the example illustrated in FIGS. 6 and 7, the total array would be 250,000 equally-spaced structures length-wise and 3 wide. Widths of approximately 100 structures can be used without further probe-structure modification, but the requirement that CVD gas readily reach the inner tip regions necessitates additional gas delivery channels in the field-emitting probe if this number is greatly exceeded.

The primary advantage of the multi-tipped field-emitting probe is that each probe tip extension can be utilized to simultaneously fabricate one nanostructure on a nearby substrate. The critical problem of obtaining self-regulating, equal-deposition or equal-etching below each probe tip extension is solved by the methods hereinafter described. Furthermore, since each probe tip extension is the end of an extended nanostructure, this ensures that field emission occurs at each tip, that deposition or etch gas can reach each tip region, and that any occasional, undesired deposition on the probe does not cause process failure.

In FIGS. 6 and 7 the array of equal depth and shaped nanostructure probe tip extensions 21, in planned positions, extend from about 50 to about 1000 in length from beyond the flat probe end surface 23. Preferably, these extensions extend about 500 Å from the end surface of each extension is about 25 to about 200Å, preferably about 100Å. The probe tip nanostructure spacings fix the final nanostructure-device spacing on the VLSI substrate; FIG. 6 illustrates an example of a 400Å × 400Å, evenly-spaced array of shaped probe nanostructure extensions 21. It should be apparent to those skilled in the art that different size spacings could be used for VLSI semiconductor circuits (for example in the range of about 50Å × 50 Å to about 1000 Å × 1000 Å), as well as unequal spacings, but the overall spacing pattern would preferably repeat at regular intervals.

The overall shape of each nanostructure probe tip extension can be varied, but gas must be able to pass readily between the structures, and for etching they must be long enough to reach the bottom of the etch-trough. Thus, as previously mentioned they should extend at least 50 Å from the flat probe surface and there should be fractionally-large gaps between them. In this way, adequate gas flow is ensured while at the same time field-emission current is prevented from being drawn to the CVD molecule until it arrives in the narrow current-impact region below a probe tip extension termination point.

The shape of each nanostructure probe tip extension termination point 25 is important for deposition, as this determines the spatial width of the field-emission electron beam when it strikes the substrate, and therefore determines the current impact zone. One effective deposition tip shape, as illustrated in FIGS. 3 and 5A through 5C, is a taper to a single crystal unit plane cell, with a lower work-function atom placed at the center of this cell. Another useful tip shape is a taper to a single atom, as illustrated in FIG. 1. For trough etching, a blunt or trapezoidal end can be employed (as illustrated in FIGS. 5A and 5B).

The parallel-process nanostructure fabrication method involves placing the probe end 23 above an atomically substantially flat crystal substrate, such that each nanostructure probe tip extension 21 is nearly an equal distance, preferably about 10 Å, above the substrate. (An initial etch cycle can be used to achieve initially equal gaps on substrates that are not quite atomically flat.) The probe end is preferably 2–10V negatively biased and an equal field-emission current then leaves each probe tip nanostructure extension. The probe end position is initially adjusted by low-voltage (approximately 0.1V), current-controlled feedback as for an STM. The tip-position is then held constant while a deposition (CVD-type) gas or an enchant (e.g. $F_2$) is introduced into the vacuum system. An even amount of deposition or etching then occurs almost simultaneously below every tip.

Figure 2A:
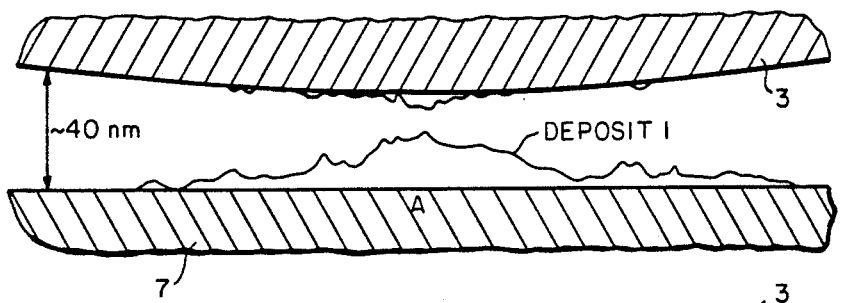
FIGS. 2A–2D illustrate the step-by-step growth of a nanostructure probe tip extension on the end of a field-emitting probe.
Figure 2B:
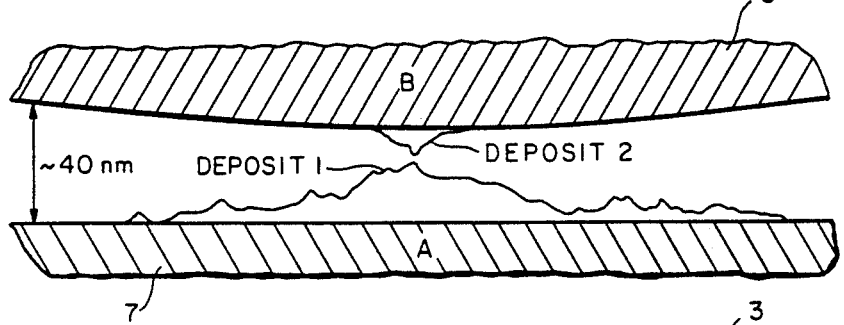
Figure 2C:
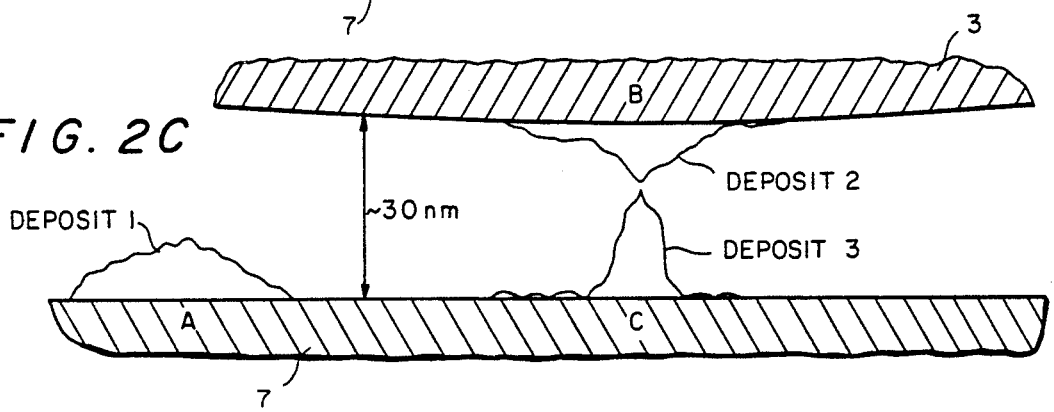
Figure 2D:
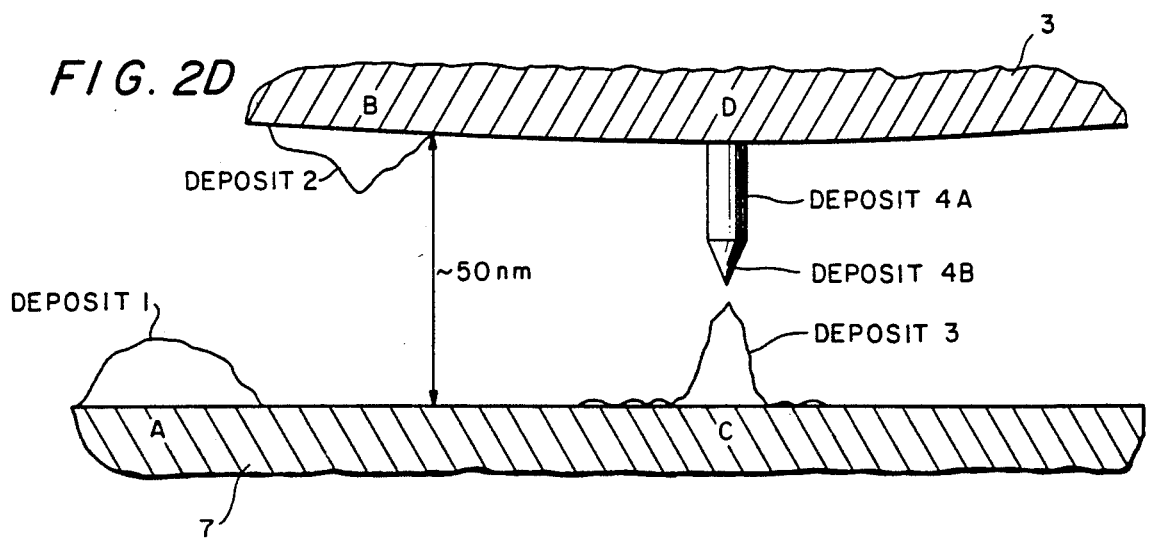
Figure 8A:
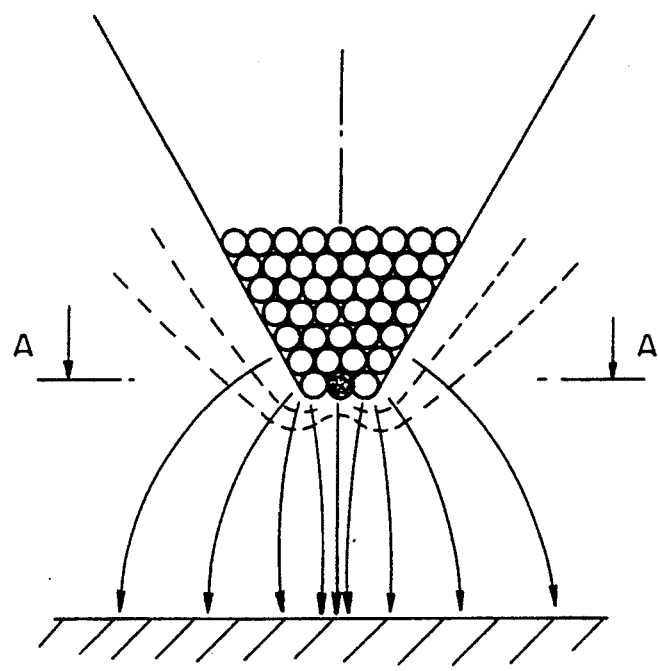
Figure 8B:
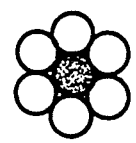

In order to achieve self-regulating, equal deposition below each of the probe tips, a portion of each probe tip nanostructure extension is preferably made of resistive material and a voltage drop of greater than 50% of the probe voltage initially occurs through each probe nanostructure (Such a probe tip extension is illustrated in FIG. 2D, where Deposit 4A can be the resistive material and Deposit 4B can be the metal conductor). When an atom is deposited below one probe tip nanostructure extension, the resulting gap decrease (e.g. from 8 to 6 Å) causes a current increase, lowering the magnitude of the nanostructure-tip voltage and thereby terminating deposition below that tip. For example, the probe voltage may be −10V and each tip voltage is initially −4V. After deposition occurs below one tip its current increases approximately 50% and its tip voltage becomes −1V.

For the FIGS. 6 and 7 example of 500 Å long × 100 wide × 400 Å spaced apart nanostructure probe tip extensions 21, at approximately $10^{-9}$A per tip this requires a nanostructure resistivity of about 1000 Ω cm. This value is appropriate to intrinsic Si, while any desired value can be achieved by choosing a nanostructure crystal material with an appropriate band gap, in combination with probe temperature or doping. (It should also be noted that this automatic deposition regulation can also correct for lack of initial substrate flatness).

It should further be noted that the high current ($>10^{-5}$A) "local substrate heating" deposition method in mechanism (A) cannot be used for this resistive-nanostructure method of achieving equal deposition below many tips, as the power dissipation in the probe tip extension is excessive. The substrate-heating method still has utility in some cases, using conducting (metal) probe nanostructures, because a self-regulating voltage drop occurs in the substrate and substrate nanostructure. In addition, when writing metal leads or in other fabrication steps not requiring single-atom deposition control one can accept statistical variations in deposition below each probe tip. In the resistivity-regulated deposition method the tips are very close (approximately 10 Å) to the deposition site and one normally waits slightly longer than $\gamma \times \ln N$ ($\gamma$=average deposition time under one tip; N=total number of tips) before stepping to the next deposition position. Thermal or other deposition with statistical variations is achieved with steady, total probe-current controlled motion away from the substrate, while maintaining a much larger (typically approximately 100 Å) tip-substrate separation to minimize tip-current differences.

The parallel-process fabrication tool and method is especially desirable since field-emission-current controlled small-structure fabrication using a single current-emitting point on a probe, can only fabricate one device at a time. Gas deposition at an activated substrate-nanostructure atomic site can be made to occur very rapidly, but mechanical probe-positioning and electrical deposition-detection and controls are considerably slower. Thus, at least 1 second is normally required to construct a single ($10^4$–$10^6$ atom) nanostructure. As $>10^9$ structures per VLSI are involved, the parallel-process tool and method according to the invention thus gain considerable practicality.

In the case of etching, conducting nanostructure probe tip extensions are used and an equal amount of etching occurs below each tip after a time period of slightly longer than $\gamma \times \ln N$, where N is the total number of tips and $\gamma$ is the average (1/e) etching time under one tip. This equal etching occurs because the tip-substrate gap increases as substrate etching occurs below each tip. This lowers the electric field at the tip, thereby lowering the emission current and the etch rate at this tip relative to those where less etching has so far occurred. Thus, a self-regulating, equal etching is achieved below the fixed-voltage array of tips. When etching has occurred to the desired depth, normally approximately 5 Å below all tips, this is detected through the overall probe-current decrease. The probe voltage is then decreased and the probe is stepped closer to the substrate, using STM-type current feedback at about 0.1V probe voltage, then the voltage is increased and the etch process is repeated.

In constructing VLSI semiconductor arrays, as well as for X-ray and $\gamma$ ray gratings and other purposes, it is important to maintain accurate lateral dimensional accuracy across the entire array. The piezoelectric crystals used for STM probe tip positioning are subject to severe nonlinearities and hysteresis, so the x and y-direction control voltages cannot be used alone for the purpose. A substrate marker or indexing method is therefore used to achieve very accurate lateral positioning accuracy.

Three resistive probe tip extensions are first placed in an "L" shaped configuration with spacing D, approximately 5,000 Å on the end of a probe. These tip extensions are then used to simultaneously deposit three substrate markers, one below each tip. The probe is then moved in the low-voltage STM-scanning mode a distance of approximately D in the x-direction parallel to one arm of the "L". When the central probe nanostructure passes over the marker previously placed at the distance D, this is detected in the z scan voltage and the probe is thereby exactly placed above this substrate structure. The probe is then used to make deposits in this new position. Due to the self regulating deposition below resistive probes, only two new markers (deposits) result, namely, those on the substrate positions not previously marked (deposited). This process is repeated with x and y steps of D until the substrate is covered with a very regular and accurate array of markers, spaced by distance D. The final VLSI or other device is then constructed by referencing the position of a different probe, which ends in the array of multi-tipped field-emitting nanostructures tips, to these markers.

It is readily appreciated that one is not limited to an "L" shaped configuration as other two-dimensional arrays will also permit simultaneous X-Y marking. Further, one may utilize only two probe tip extensions for separate X and Y markings. It is also apparent that a variety of multiple tip deposition and/or etching techniques could be used. Further, the description in Examples 2 and 3 below may be equally applied to form large scale marker arrays. The essential feature is that plural probe tip extensions are utilized on a single probe with STM feedback to fix each repositioning with high accuracy to permit each successive marking.

The most important immediate application of the present invention is to VLSI logic circuits and memory elements for computers and other microcircuits. Here the factor of about $10^4$ greater packing density compared to present devices is profoundly significant to speed and heat-removal size limitations, as well as to production and assembly costs.

The invention can also be used for direct device production, as well as to make lithographic masks which are used for device production. Thus, the invention permits new, vastly improved nanolithography.

Other fields that could utilize this nanostructure capability include fast optics, optical computing and micro-superconductors. In the areas of chemistry and biology those skilled in the art can envisage longer-term goals of controlling chemical reactions and splitting and reacting biological-molecules with nanostructures whose shape, constituents, and chemical characteristics are designed to obtain the desired result. Thus it should be apparent that the present invention has potentially more uses than semiconductor VLSI.

There is currently no competing technology for small-structure ($<100$ Å dimensions) fabrication; although beam-based lithography may advance to the necessary dimensional accuracy, it must also overcome damage and random doping error. There is also no competing technology for small-structure fabrication with control of the number and positions of individual atoms in that structure.

Numerous modifications and variations of the present invention are possible in light of the above teachings. It is therefore to be understood that within the scope of the appended claims, the invention may be practiced otherwise than as specifically described herein.

EXAMPLES

The following examples are illustrative of the invention described herein, and should in no way be construed as limiting. All examples utilize traditional STM technology.

Example 1 describes the use of the field-emitting probe and probe tip extension in depositing a Si-based semiconductor diode.

Example 2 is an example of fabricating 20 linear arrays of 100 equally-spaced resistive probe tip extensions on the end of a field-emitting probe.

Example 3 describes the use of the 2000 probe tip extension array in constructing a large array of equally-spaced Si nanoscale diodes, with electrodes, on a conducting substrate.

EXAMPLE 1

An example of microtip-controlled nanostructure fabrication, uses a 270×270 cross section, approximately 700 Å high silicon p-n diode as an example structure. The p layer was a 270 Å cube that would contain approximately 100 atomic layers in each direction, with a boron atom at approximately every 10th atomic site in each direction for a doping fraction of $10^{-3}$. The n layer was a 270 Å cube on top of the p layer, with equivalent doping except for phosphorous atoms rather than boron. A 270×270×160 Å tungsten electrode capped the structure. In a full circuit this electrode would have extended across insulating layers such as $SiO_2$ or $Si_3N_4$ to other circuit elements, and these insulating layers would also have been deposited by microtip-controlled deposition.

The diode was constructed by first bringing the probe nanostructure tip extension (Deposit 4 of FIG. 2D) to within approximately 10 Å of the conducting substrate surface using scan-voltage ($V_p$ approximately $-0.1V$) STM current feedback. A feedback loop was then opened, silane gas ($SiH_4$) was introduced at approximately $10^{-2}$ Torr, the probe voltage was increased to approximately $-10V$ and the probe current (i) was monitored. When i suddenly increased from an initial value of 1 nA, indicating Si atom deposition below the tip, the probe was translated 2.7 Å in the x direction to the next surface atomic site. The single-atom deposition process was then repeated at this position, with the resulting step in i initiating the next x-direction step. The probe was thus raster scanned in the x and y directions, stepping 2.7 Å at a time, until a single atomic layer 270Å×270 Å was deposited above the substrate surface. The probe was then returned to the original x-y coordinate and this process was repeated for the second layer.

The probe x-y scans were initially setup to closely parallel the substrate surface using low-voltage, current-feedback STM scans to establish any z(x,y) corrections. These corrections as well as z drift were readjusted at regular intervals during the deposition raster scans, by briefly returning to the low-voltage scan mode. (This was computer controlled.) The average rate of atom deposition was proportional to the gas pressure and the probe current. The deposition rate was approximately $10^3$ depositions per second.

When 10 layers of Si had been deposited (a 270 Å×270 Å×27 Å high structure), the silane was evacuated and approximately $10^{-3}$ Torr of diborane ($B_2H_6$) was then introduced. The probe tip was then sequentially stepped to 100 equally spaced (27 Å spacing) x-y positions within the raster. B atom deposition was induced and detected at each position using the method described two paragraphs above. Diborane was then removed, silane was again introduced, and 10 more layers of Si were deposited. This was followed by B deposition (always with low voltage position corrections at regular intervals). The 270 Å cube p layer was thus constructed in 10 steps of 10 Si layers each, with B doping every 10 layers. The next n-type Si cube was then constructed on top of the p layer by continuing the raster scans, successively depositing 100 layers of Si with 100 phosphorous atoms every 10 layers. Here the P atoms were deposited from approximately $10^{-3}$ Torr of phosphene $P_2H_5$ gas. Finally, the tungsten (W) electrode was deposited on top of the n layer, again one atomic layer at a time using the same x,y raster scan for each layer. Here the W was carried by $WF_6$ gas, and $H_2$ assisted the deposition by HF evolution (a standard CVD method). Other volatile W-carrying gases or other metals could be used for the electrode. In the present example the electrode was unconnected, whereas in a circuit an insulator would be deposited between structures and the W layer would span these to make connections.

The desired crystallinity of the Si layers was assisted by maintaining the substrate at approximately 200° C, but the entire STM had to be in thermal equilibrium before deposition was commenced to minimize tip position drifts. Alternatively, room temperature deposition can be used and small regions of the diode nanostructure which are not crystalline can be crystallized after growth by heating the substrate to approximately 600° C in vacuum.

In the above example, approximately $3 \propto 10^6$ atoms were deposited, and at the $10^3$/s rate for currently available STM's this required approximately 1 hour. Gas changes consumed another ten minutes.

EXAMPLE 2

A two-step array-bootstrapping procedure for constructing a probe with a 20×100 array of equally (500 Å) spaced, resistive probe tip extensions. 50 tips were first deposited on the substrate, then these were used to place 2000 almost identical tips on a probe. Each tip was a 200 Å high, 200 Å diameter, resistive GaAs cylinder capped with a conducting W cone. (A similarly-shaped structure was shown in FIG. 2D, although the dimensions differ somewhat. Here deposit 4A was the GaAs cylinder and 4B the W cone.)

A row of 50 Se-doped, resistive GaAs cylinders at 500 Å spacing were first deposited one at a time. The method of Example 1 was used to deposit one atomic layer at a time, alternately from $Ga(CH_3)_3$ and $AsH_3$, with $H_2Se$ used (separately as in Example 1) for occasionally adding the Se electron donor. ($AsCl_3$ and $GaH_3$ can also be used, as can other dopants.) Again, elevating the temperature by 100–200° C assists crystallinity but is not essential. The heating method was indirect, and involved partially enclosing the probe wire and substrate with a small heated surface that radiatively heats the active region while minimally heating the STM piezo crystals. The doping was adjusted to obtain a resistance of approximately $5 \times 10^9$ Ω, corresponding to a resistivity of approximately $10^4$ Ω cm. The W cone was then deposited, one atom at a time, on top of each cylinder using $WF_6+H_2$ as described in Example 1.

These 50 tips were deposited near substrate locating scratches that were visible to an optical microscope, so that the initial, single W-nanotip probe could then be replaced and the new probe-end could be positioned near the 50 substrate structures. The tip of this second tungsten-wire probe had been ground and polished to an approximately 15 μm long knife-edge, as seen with an optical microscope. This probe was first moved to flat regions of the substrate and atomic-scale flattened by field-induced ion desorption. It was then positioned approximately 10 Å above the 50 substrate-structure tips, using STM scanning signals. The probe voltage was set at approximately +15V and the total tunneling current at approximately 50 nA so that the (W) structure tips were at approximately +10V. $Ga(CH_3)_3$ and $AsH_3$ were then alternately introduced (approximately 0.1 Torr) and GaAs deposition occurred on the probe end opposite the 50 tips. For a given pressure and single-tip current this required slightly more than ln $(50) \approx 4$ times as long as deposition opposite one tip.

For each probe position, deposition opposite each tip occurred at a higher rate for slightly larger tip-substrate gaps, since the current was then lower and the voltage on the tungsten tip was larger. As the current through a tip rose to approximately 2 nA, due to atomic deposition and the resultant decreasing gap, this tip voltage decreased to approximately +5V and deposition largely ceased below this tip. It should be noted that this corrected for initial small spacing irregularities at the different tips. (The chemical character of alternate-layer Ga and As deposition also achieved this deposition-termination effect, but the resistive-tip method described here is more universal, and also works for the W cone, and is the subject of the example.) When sufficient time had elapsed to achieve atomic deposition opposite all tips (discernable as a stable total current of approximately 100 nA) the probe was stepped to the next atomic position. The flattened-knife-edge probe was thus raster scanned within a 200 Å diameter circle above the 50 substrate tips to simultaneously construct the 50 GaAs cylinders. Doping was done as described above for single nanostructures. After the GaAs cylinders were constructed, deposition from $WF_6 + H_2$ with shrinking raster scans was used to simultaneously grow the 50 W cones on top of the cylinders.

After the first row of 50 tips were grown on the knife-edge probe, the probe was moved 500 Å to the side (y direction) and the adjacent row was grown by the same procedure. This was repeated until 20 adjacent rows of 50 probes were produced. Low voltage (<1V) was then applied to the probe and it was moved forward (x direction) in the STM scan mode until the tunneling current indicated that the last probe tip structure was above the last of the row of 50 substrate tips. The probe was then moved 500 Å further in the x direction and lowered to approximately 10 Å above the substrate, in preparation for the next 50-tip deposition that would extend the row to a total length of 100 tips. The necessary 50,000 Å, x-direction displacement was thus very accurately determined. (Using this procedure for repetitively extending an array in one direction, this motion can be extended as far as desired without accumulating distance error, i.e., a very evenly-repeating pattern is achieved without requiring precise scan linearity or any additional length-referencing method. By also depositing a few reference structures on the substrate at fixed y spacings e.g. 10,000 Å from the row of 50 substrate tips, equivalent equal-step accuracy is similarly achieved in the y direction. This extremely accurate large-array positioning method allows equivalent devices, as well as differently-spaced components such as metal interconnects, to be simultaneously deposited at the correct positions over large regions of circuit arrays. Similarly, lithographic masks can be etched with exceptional positioning accuracy. It is also very valuable for x-ray and $\gamma$-ray gratings and other optical purposes.)

The bootstrapping procedure from 1 to 50 to 2000 nanostructures in the above example could be extended as many cycles as needed, but the total useful width of a probe tip array is somewhat limited by the necessity of gas transport between the array of tip extension structures, as well as by substrate flatness.

EXAMPLE 3

Constructing a large array of Si diodes using the 2000 resistive-tip-structures made in Example 2 followed the combined procedures of Examples 1 and 2. $SiH_4$ and dopant gases were used as before, followed by $WF_6 + H_2$ for the electrodes, and the typical deposition time required at each probe position was maintained below 10 ms by raising the gas pressure by the factor ln $2000 \approx 8$ for random deposition at all positions. It was also necessary to assure initial flatness of the substrate, so that it accurately matched the 2000 tips. This was most readily done by using the tips to etch the substrate, using $F_2$ or $SF_6$ and the probe at approximately +15V while raster scanning across the region to be used for deposition. (Another useful pre-flattening method would be to scan a normal STM probe, with a typical etched tungsten tip of approximately 2000 Å radius above the substrate. The probe would be negatively biased to induce field-ion-desorption flattening of an oriented crystalline substrate. As noted above, small initial flatness errors are also corrected by the resistive-tip-controlled deposition, since deposition continues beneath all tips until a single, small gap is reached.)

What is claimed is:

1. A device for the fabrication of molecular or crystalline nanostructures on a substrate surface comprising:
   a field emitting probe having an end surface, and
   at least one probe tip extension which extends from the end surface of said probe, said probe tip extension having a length of about 20–1,000 Å and a diameter or width of about 25–200 Å, said probe tip extension having an end distal from said probe end surface, said distal end comprising a single crystal plane and terminating in a single crystal unit plane cell, said unit plane cell having a central atom with a lower work function than the atoms surrounding said central atom
   said end surface of said probe being substantially larger than said probe tip extension.

2. A device for the fabrication of molecular or crystalline nanostructures on a substrate surface as claimed in claim 1, wherein said end surface of said probe has a radius of curvature of about 1,000 Å.

3. A device for the fabrication of molecular or crystalline nanostructures on a substrate surface as claimed in claim 2, wherein said probe tip extension has a length of about 50–150 Å.

4. A device for the fabrication of molecular or crystalline nanostructures on a substrate surface as claimed in claim 2, wherein said probe tip extension has a width of about 25 Å and a length of about 70 Å.

5. A device for the fabrication of molecular or crystalline nanostructures on a substrate surface as claimed in claim 1, wherein said probe tip extension has a length of about 50–150 Å.

6. A device for the fabrication of molecular or crystalline nanostructures on a substrate surface as claimed in claim 1, wherein said probe tip extension has a width of about 25 Å and a length of about 70 Å.

7. A device for the fabrication of molecular or crystalline nanostructures on a substrate surface comprising a field emitting probe having at least one probe tip extension, said extension having an end which comprises a single crystal plane terminating in a single crystal unit plane cell, said unit plane cell having a central atom with a lower work function than the atoms surrounding said central atom.

* * * * *